United States Patent
Chen et al.

(10) Patent No.: US 12,464,652 B2
(45) Date of Patent: Nov. 4, 2025

(54) MANUFACTURING METHOD OF ELECTRONIC DEVICE AND ELECTRONIC DEVICE

(71) Applicant: Innolux Corporation, Miaoli County (TW)

(72) Inventors: Ying-Jen Chen, Miaoli County (TW); Yan-Zheng Wu, Miaoli County (TW)

(73) Assignee: Innolux Corporation, Miaoli County (TW)

( * ) Notice: Subject to any disclaimer, the term of this patent is extended or adjusted under 35 U.S.C. 154(b) by 224 days.

(21) Appl. No.: 18/479,125

(22) Filed: Oct. 2, 2023

(65) Prior Publication Data

US 2024/0164027 A1 May 16, 2024

Related U.S. Application Data

(60) Provisional application No. 63/424,487, filed on Nov. 11, 2022.

(30) Foreign Application Priority Data

Jun. 19, 2023 (CN) .......................... 202310727301.3

(51) Int. Cl.
*H05K 3/46* (2006.01)
*H05K 3/00* (2006.01)

(52) U.S. Cl.
CPC ......... *H05K 3/4635* (2013.01); *H05K 3/4697* (2013.01); *H05K 3/0014* (2013.01)

(58) Field of Classification Search
CPC ... H05K 3/4635; H05K 3/4697; H05K 3/0014
USPC ......................................................... 174/254
See application file for complete search history.

(56) References Cited

U.S. PATENT DOCUMENTS

| | | | |
|---|---|---|---|
| 2004/0135269 A1* | 7/2004 | Otsuki | H05K 3/4682 257/E23.07 |
| 2010/0068839 A1* | 3/2010 | Ray | H10F 77/122 257/E31.127 |
| 2018/0031743 A1 | 2/2018 | Wakatsuki et al. | |

FOREIGN PATENT DOCUMENTS

CN 107195790 9/2017

* cited by examiner

*Primary Examiner* — Andargie M Aychillhum
(74) *Attorney, Agent, or Firm* — JCIPRNET

(57) ABSTRACT

A manufacturing method of an electronic device includes the following steps. First, a curved substrate is formed. Next, a first conductive layer is formed on a first insulating layer. Then, a second conductive layer is formed on a second insulating layer. Thereafter, the first insulating layer and the second insulating layer are bonded to the curved substrate. The manufacturing method of the electronic device may reduce problems such as peeling and/or offset of the manufactured electronic device.

19 Claims, 6 Drawing Sheets

MANUFACTURING METHOD OF ELECTRONIC DEVICE AND ELECTRONIC DEVICE

CROSS-REFERENCE TO RELATED APPLICATION

This application claims the priority benefits of U.S. provisional application Ser. No. 63/424,487, filed on Nov. 11, 2022, and China application serial no. 202310727301.3, filed on Jun. 19, 2023. The entirety of each of the above-mentioned patent applications is hereby incorporated by reference herein and made a part of this specification.

BACKGROUND

Technical Field

The disclosure relates to a manufacturing method of an electronic device and an electronic device, and particularly relates to a manufacturing method of a curved electronic device and a curved electronic device.

Description of Related Art

In a manufacturing process of existing curved electronic devices, laminated conductive layer, insulating layer and substrate are heated to form a curved laminated body; however, the curved laminated body is easy to cause problems such as peeling and/or offset of the layers in the existing curved electronic device due to different thermal expansion coefficients of the layers.

SUMMARY

The disclosure is directed to a manufacturing method of an electronic device, which may reduce problems such as peeling and/or offset of the manufactured electronic device.

According to some embodiments of the disclosure, a manufacturing method of an electronic device includes the following steps. First, a curved substrate is formed. Next, a first conductive layer is formed on a first insulating layer. Then, a second conductive layer is formed on a second insulating layer. Thereafter, the first insulating layer and the second insulating layer are bonded to the curved substrate.

The disclosure is directed to an electronic device, which reduces problems such as peeling and/or offset.

According to some embodiments of the disclosure, an electronic device includes a substrate, a first conductive layer, a first insulating layer, a second conductive layer, and a second insulating layer. The substrate has a first surface and a second surface opposite to the first surface, where the first surface is a convex surface and the second surface is a concave surface. The first conductive layer is disposed on the first surface of the substrate. The first insulating layer is disposed between the first conductive layer and the substrate. The second conductive layer is disposed on the second surface of the substrate. The second insulating layer is disposed between the second conductive layer and the substrate. An adhesive layer is disposed between the first insulating layer and the substrate and/or between the second insulating layer and the substrate. The first conductive layer has an arc length along a specific direction, where the arc length is between a half of a wavelength of a signal transmitted between the first conductive layer and the second conductive layer and the wavelength of the signal. A distance between the first conductive layer and the second conductive layer is between a quarter of the wavelength of the signal transmitted between the first conductive layer and the second conductive layer and the wavelength of the signal.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
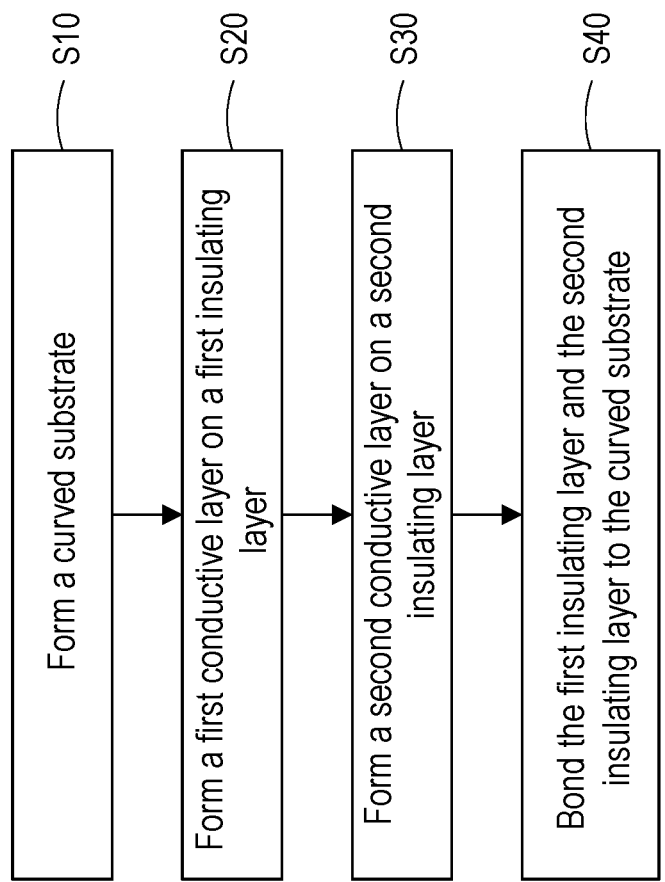
FIG. 1 is a flowchart of a manufacturing method of an electronic device according to an embodiment of the disclosure.

Reference will now be made in detail to the embodiments of the disclosure, examples of which are illustrated in the accompanying drawings. Wherever possible, the same reference numbers are used in the drawings and the description to refer to the same or like parts.

Certain terms are used throughout the specification of the disclosure and the appended claims to refer to specific components. Those skilled in the art should understand that electronic device manufacturers may probably use different names to refer to the same components. This specification is not intended to distinguish between components that have the same function but different names. In the following specification and claims, the terms "including", "containing", "having", etc., are open terms, so that they should be interpreted as meaning of "including but not limited to . . . ". Therefore, when the terms "including", "containing", and/or "having" are used in the description of the disclosure, they specify existence of corresponding features, regions, steps, operations, and/or components, but do not exclude existence of one or more corresponding features, regions, steps, operations, and/or components.

Directional terminology mentioned in the specification, such as "top", "bottom", "front", "back", "left", "right", etc., is used with reference to the orientation of the figures being described. Therefore, the used directional terminology is merely illustrative, and is not intended to be limiting of the disclosure. In the figures, the drawings illustrate general characteristics of methods, structures, and/or materials used in specific embodiments. However, these drawings should not be construed as defining or limiting of a scope or nature covered by these embodiments. For example, for clarity's sake, a relative size, a thickness and a location of each film layer, area and/or structure may be reduced or enlarged.

When a corresponding component (for example, a film layer or an area) referred to be "on another component", the component may be directly located on the another component, or other components probably exist there between. On the other hand, when a component is referred to be "directly on another component", none other component exits there between. Moreover, when a component is referred to be "on another component", the two components have an up-down relationship in a top view, and this component may be above or below the another component, and the up-down relationship depends on an orientation of the device.

The terms "about", "equal to", "equivalent" or "identical", "substantially" or "approximately" are generally interpreted as being within a range of 20% of a given value or range, or as being within a range of 10%, 5%, 3%, 2%, 1%, or 0.5% of the given value or range.

The ordinal numbers used in the specification and claims, such as "first", "second", etc., are used to modify components, and do not imply and represent the component or these components have any previous ordinal numbers, and do not represent a sequence of one component with another, or a sequence in a manufacturing method. The use of these ordinal numbers is merely to make a clear distinction between a component with a certain name and another component with the same name. The same terms may not be used in the claims and the specification, and accordingly, a first component in the specification may be a second component in the claims.

It should be noted that, in the following embodiments, the features of several different embodiments may be replaced, reorganized, and mixed to complete other embodiments without departing from the spirit of the disclosure. As long as the features of the various embodiments do not violate the spirit of the disclosure or conflict with each other, they may be mixed and matched arbitrarily.

The electrical connection or coupling described in the disclosure may refer to direct connection or indirect connection. In the case of direct connection, terminals of components on the two circuits are directly connected or connected to each other by a conductor line segment, and in the case of indirect connection, there are switches, diodes, capacitors, inductors, other suitable components, or a combination of the above components between the terminals of the components on the two circuits, but the disclosure is not limited thereto.

In the disclosure, thickness, length and width may be measured by using an optical microscope, and the thickness may be measured through a cross-sectional image in an electron microscope, but the disclosure is not limited thereto. In addition, any two values or directions used for comparison may have certain errors. If a first value is equal to a second value, it implies that there may be an error of about 10% between the first value and the second value; if a first direction is perpendicular to a second direction, an angle between the first direction and the second direction may be between 80 degrees and 100 degrees; and if the first direction is parallel to the second direction, the angle between the first direction and the second direction may be between 0° and 10°.

An electronic device of the disclosure may include functions of antenna (such as liquid crystal antenna), display, lighting, sensing, touch, splicing, other suitable functions, or a combination of the above functions, but the disclosure is not limited thereto. The electronic device includes, but is not limited to, a curlable or flexible electronic device, but the disclosure is not limited thereto. The display device may, for example, include liquid crystal (liquid crystal), light emitting diodes (LED), quantum dot (QD), fluorescence, phosphor, other suitable materials or a combination of the above-mentioned materials. The light emitting diodes may, for example, include organic light emitting diodes (OLEDs), micro-LEDs, mini-LEDs or quantum dot LEDs (QLEDs, QDLEDs), but the disclosure is not limited thereto. The antenna device may include, for example, a frequency selective surface (FSS), a radio frequency filter (RF-Filter), a polarizer, a resonator, or an antenna, etc. The electronic components may include capacitors, resistors, inductors, diodes, transistors, circuit boards, chips (chips), dies, integrated circuits (ICs) or a combination of the above components or other suitable electronic components, but the disclosure is not limited thereto.

Exemplary embodiments of the disclosure are illustrated below, and the same reference numerals are used in the drawings and descriptions to denote the same or similar parts.

Figure 2:
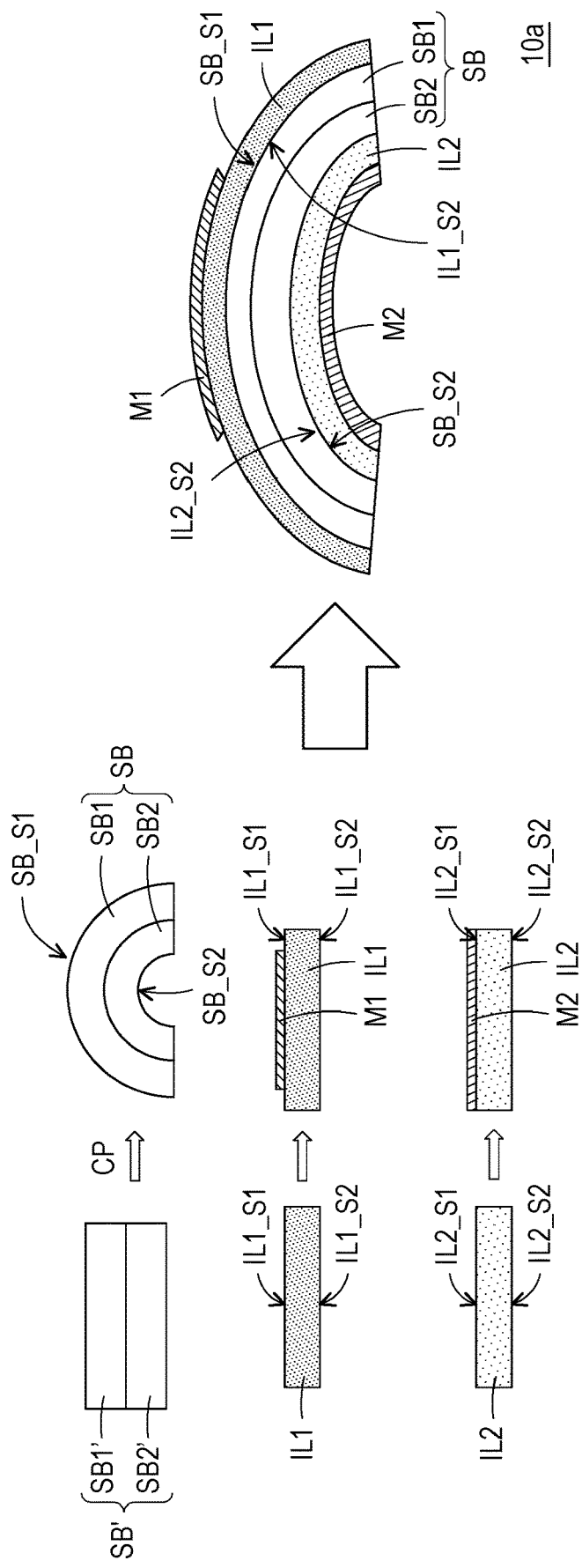
FIG. 2 is a schematic cross-sectional flowchart of a manufacturing method of an electronic device according to a first embodiment of the disclosure.

FIG. 1 is a flowchart of a manufacturing method of an electronic device according to an embodiment of the disclosure, and FIG. 2 is a schematic cross-sectional flowchart of a manufacturing method of an electronic device according to a first embodiment of the disclosure.

Referring to FIG. 1 and FIG. 2 at the same time, in step S10, a curved substrate SB is formed.

In some embodiments, the curved substrate SB may be formed by performing following steps, but the disclosure is not limited thereto.

First, a substrate SB' is provided. The substrate SB', for example, has good supportability and/or stability, which may be used to carry film layers subsequently formed thereon, and may, for example, withstand a temperature of a subsequent heating process that makes it curving. In some embodiments, a material of the substrate SB' may include glass, plastic or a combination thereof, where the material of the substrate SB' may be selected such that the substrate SB' has a lower dielectric constant (Dk) and/or has a lower dissipation factor (Df), so as to reduce the loss of signals transmitted therein. Alternatively, in some other embodiments, the material of the substrate SB' may be the same or similar to that of a first insulating layer IL1 or a second insulating layer IL2 to be described later, which is not limited by the disclosure.

In some embodiments, the substrate SB' may include a multilayer structure. For example, in the embodiment, the substrate SB' includes a laminated structure of a substrate SB1' and a substrate SB2', but the disclosure is not limited thereto. A material of the substrate SB1' and a material of the substrate SB2' may be the same as or different from each other, which is not limited by the disclosure.

Then, a curving process CP is performed on the substrate SB' to curve the substrate SB' to form the curved substrate SB. In some embodiments, the curving process CP performed on the substrate SB' may include a heating process, where a temperature, time or other process conditions for performing the heating process on the substrate SB' may be set based on the materials included in the substrate SB', which are not limited by the disclosure. The curved substrate SB may have, for example, a first surface SB_S1 and a second surface SB_S2 opposite to each other, where the first surface SB_S1 is, for example, a convex surface, and the second surface SB_S2 is, for example, a concave surface, but the disclosure is not limited thereto. In the embodiment, the curved substrate SB includes a laminated structure of a substrate SB1 and a substrate SB2, a surface of the substrate SB1 away from the substrate SB2 is a convex surface (the first surface SB_S1), and a surface of the substrate SB2 away from the substrate SB1 is a concave surface (the second surface SB_S2), but the disclosure is not limited thereto.

Referring to FIG. 1 and FIG. 2, in step S20, a first conductive layer M1 is formed on the first insulating layer IL1.

The first conductive layer M1 may be, for example, formed by first performing a sputtering process, an evaporation process, a screen printing process or other suitable processes to form a first conductive material layer (not shown) on the first insulating layer IL1, and then performing a patterning process on the first conductive material layer to form the first conductive layer M1, but the disclosure is not limited thereto. In some embodiments, a material of the first conductive layer M1 may include metal. For example, the material of the first conductive layer M1 may include copper, aluminum or other suitable metals, but the disclosure is not limited thereto.

The first insulating layer IL1 has, for example, a first surface IL1_S1 and a second surface IL1_S2 opposite to each other, where the first conductive layer M1 is formed on the first surface IL1_S1 of the first insulating layer IL1, but the disclosure is not limited thereto. In the embodiment, the first insulating layer IL1 serves as a substrate for carrying the first conductive layer M1. Therefore, in some embodiments, a material of the first insulating layer IL1 may include low temperature co-fired ceramic (LTCC), glass fiber (GF), plastic, resin, non-woven material, ceramics, liquid crystal polymer (LCP), cyclo olefin polymer (COP), polyethylene naphthalate (PEN), other suitable insulating materials or a combination of the above materials, but the disclosure is not limited thereto. It should be noted that, although not shown in FIG. 1 and FIG. 2, step S20 may further include providing a first substrate for supporting the above-mentioned first conductive layer M1 on the first insulating layer IL1, where the first insulating layer IL1 and the first conductive layer M1 are sequentially formed on the first substrate. In this case, the material of the first insulating layer IL1 may include polyimide (PI), silicon nitride, silicon oxide, ajinomoto buildup film (ABF) carrier or other suitable insulating materials, but the disclosure is not limited thereto.

Referring to FIG. 1 and FIG. 2, in step S30, a second conductive layer M2 is formed on the second insulating layer IL2.

The second conductive layer M2 may be formed on the second insulating layer IL2 by, for example, a sputtering process, an evaporation process, a screen printing process or other suitable processes, which is not limited by the disclosure. In some embodiments, a material of the second conductive layer M2 may include metal. For example, the material of the second conductive layer M2 may include copper, aluminum or other suitable metals, but the disclosure is not limited thereto. In addition, in the embodiment, the material of the second conductive layer M2 and the material of the first conductive layer M1 may be the same or different from each other, which is not limited by the disclosure.

The second insulating layer IL2 has, for example, a first surface IL2_S1 and a second surface IL2_S2 opposite to each other, where the second conductive layer M2 is formed on the first surface IL2_S1 of the second insulating layer IL2, but the disclosure is not limited thereto. In the embodiment, the second insulating layer IL2 serves as a substrate for carrying the second conductive layer M2. Therefore, in some embodiments, a material of the second insulating layer IL2 may include low temperature co-fired ceramic (LTCC), glass fiber (GF), plastic, resin, non-woven material, ceramics, liquid crystal polymer (LCP), cyclo olefin polymer (COP), polyethylene naphthalate (PEN), other suitable insulating materials or a combination of the above materials, but the disclosure is not limited thereto. In addition, in the embodiment, the material of the second insulating layer IL2 and the material of the first insulating layer IL1 may be the same or different from each other, which is not limited by the disclosure.

It should be noted that, although not shown in FIG. 1 and FIG. 2, step S30 may further include providing a second substrate for supporting the above-mentioned second conductive layer M2 on the second insulating layer IL2, where the second insulating layer IL2 and the second conductive layer M2 are sequentially formed on the second substrate. In this case, the material of the second insulating layer IL2 may include polyimide, silicon nitride, silicon oxide, ABF carrier or other suitable insulating materials, but the disclosure is not limited thereto.

In addition, an order of the step S30 and the above step S20 is not limited, i.e., the step S30 may be performed before the step S20; or may be performed after the step S20; or may be performed simultaneously along with the step S20.

Referring to FIG. 1 and FIG. 2, in step S40, the first insulating layer IL1 and the second insulating layer IL2 are bonded to the curved substrate SB.

In the embodiment, the step of bonding the first insulating layer IL1 and the second insulating layer IL2 to the curved substrate SB may include the following steps, but the disclosure is not limited thereto.

First, the surface of the first insulating layer IL1 away from the first conductive layer M1 (i.e., the second surface IL1_S2 of the first insulating layer IL1) is bonded to the first surface SB_S1 of the curved substrate SB. Then, the surface of the second insulating layer IL2 away from the second conductive layer M2 (i.e., the second surface IL2_S2 of the second insulating layer IL2) is bonded to the second surface SB_S2 of the curved substrate SB. It should be noted that the order of bonding the first insulating layer IL1 and the second insulating layer IL2 to the curved substrate SB is not limited.

In some embodiments, the first insulating layer IL1 and the second insulating layer IL2 may be respectively bonded to the first surface SB_S1 and the second surface SB_S2 of the curved substrate SB through a thermocompression bonding process, but the disclosure is not limited thereto. In other embodiments, adhesive layers (not shown) may be first provided on the first surface SB_S1 and the second surface SB_S2 of the curved substrate SB, and then the first insulating layer IL1 and the second insulating layers IL2 are respectively bonded to the curved substrate SB through the adhesive layers.

In the embodiment, since the process of forming the curved substrate SB is prior to the process of bonding the same to the first insulating layer IL1 and the second insulating layer IL2, the possibility of peeling and/or offset of the first conductive layer M1 and the second conductive layer M2 may be reduced.

Furthermore, in the embodiment, by respectively forming the first conductive layer M1 and the second conductive layer M2 on different insulating layers (the first insulating layer IL1 and the second insulating layer IL2), the possibility of damage to the first conductive layer M1 and the second conductive layer M2 due to other processes performed during the manufacturing process may be reduced.

So far, manufacturing of the electronic device 10a of the embodiment is completed, but the disclosure is not limited thereto.

Figure 3:
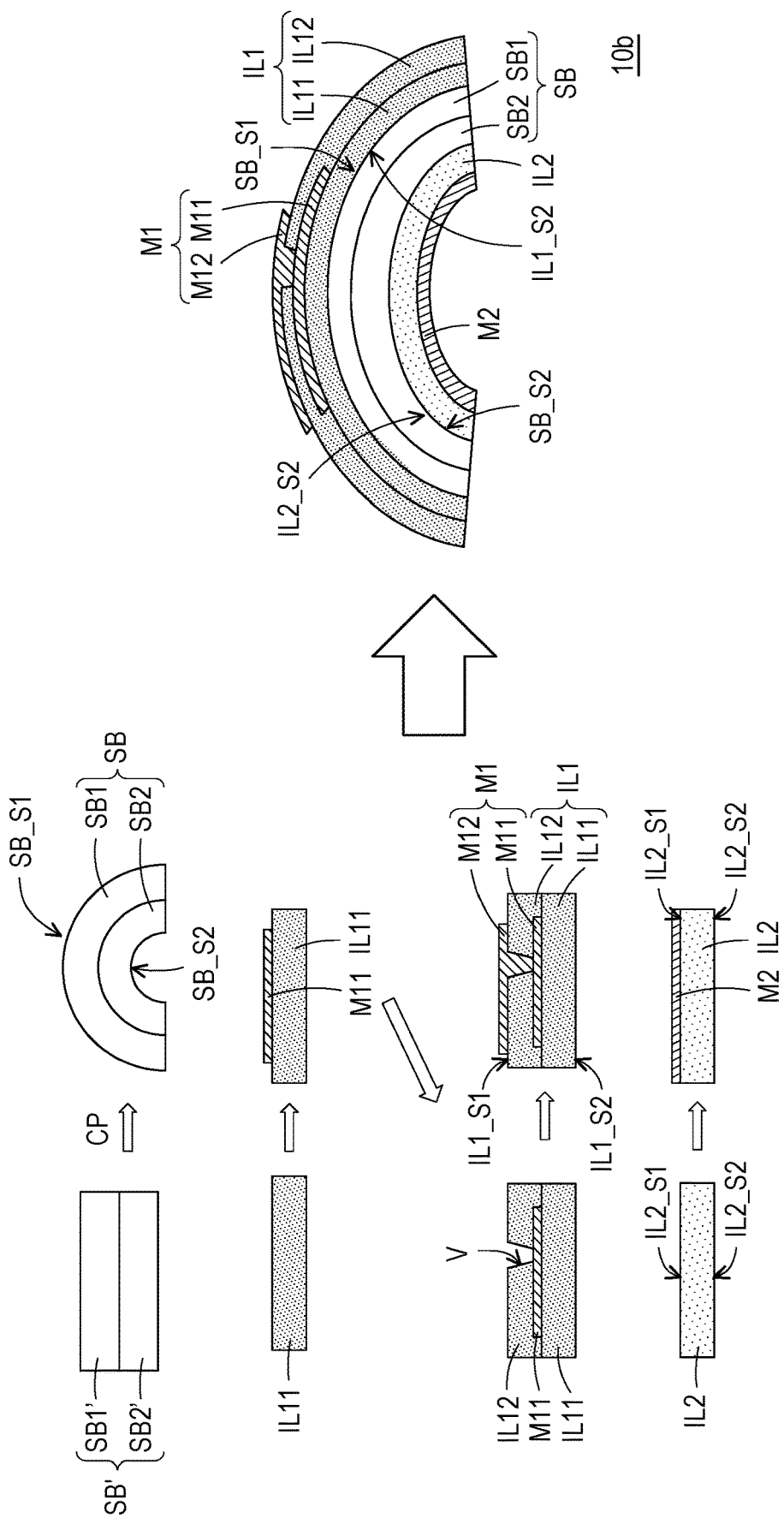
FIG. 3 is a schematic cross-sectional flowchart of a manufacturing method of an electronic device according to a second embodiment of the disclosure.

FIG. 3 is a schematic cross-sectional flowchart of a manufacturing method of an electronic device according to a second embodiment of the disclosure. It should be noted that the embodiment of FIG. 3 may continue to use the component referential numbers and a part of the content of the embodiment of FIG. 2, where the same or similar referential numbers are used to denote the same or similar components, and the description of the same technical content is omitted.

Referring to FIG. 1 and FIG. 3 at the same time, a main difference between the manufacturing method of an electronic device 10b of FIG. 3 and the aforementioned manufacturing method of the electronic device 10a is that the first conductive layer M1 includes a multi-layer structure.

In the embodiment, in the step S20 of forming the first conductive layer M1 on the first insulating layer IL1, the provided first insulating layer IL1 includes a first insulating sub-layer IL11 and a first insulating sub-layer IL12, and the first conductive layer M1 including the first conductive sub-layer M11 and the first conductive sub-layer M12 is formed.

In detail, for example, the first conductive sub-layer M11 may be first formed on the first insulating sublayer IL11; then, the first insulating sub-layer IL12 having a via V is formed on the first insulating sub-layer IL11, where the via V of the first insulating sub-layer IL12 exposes a part of the first conductive sub-layer M11; thereafter, the first conductive sub-layer M12 is formed on the first insulating sub-layer IL12, where the first conductive sub-layer M12 is electrically connected to the first conductive sub-layer M11 through the via V.

Figure 4:
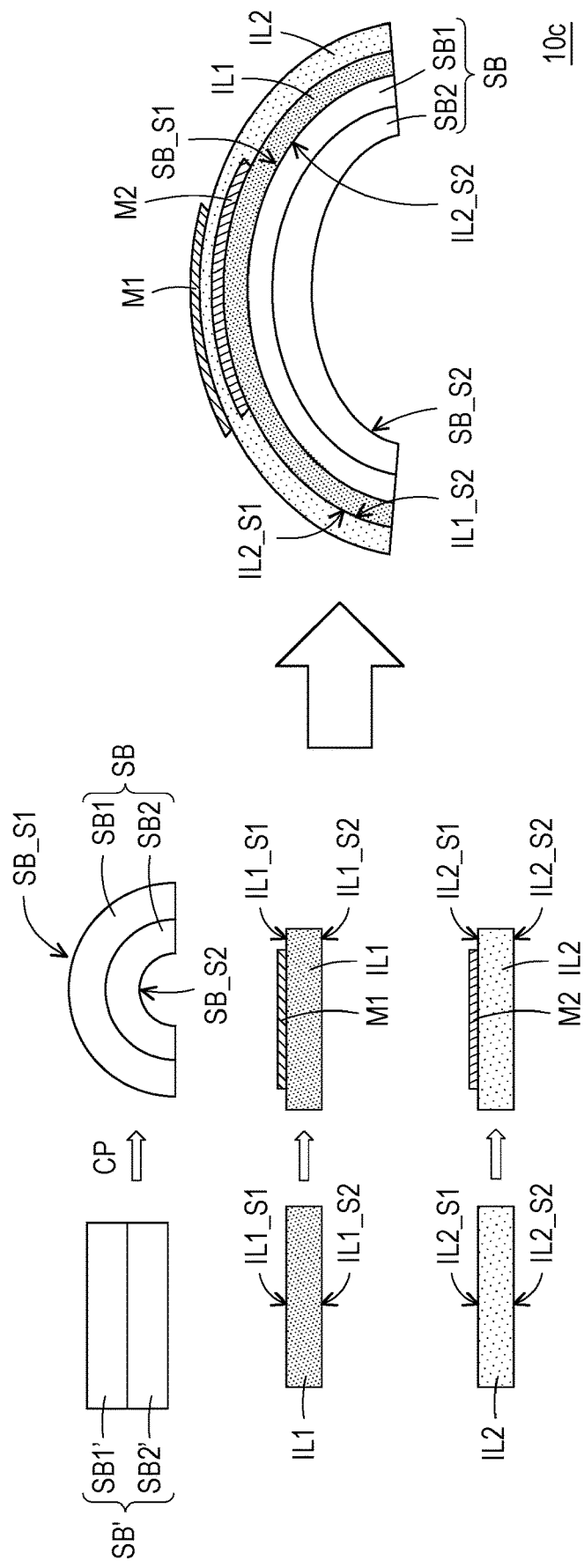
FIG. 4 is a schematic cross-sectional flowchart of a manufacturing method of an electronic device according to a third embodiment of the disclosure.

FIG. 4 is a schematic cross-sectional flowchart of a manufacturing method of an electronic device according to a third embodiment of the disclosure. It should be noted that the embodiment in FIG. 4 may continue to use the component referential numbers and a part of the content of the embodiment of FIG. 2, where the same or similar referential numbers are used to denote the same or similar components, and the description of the same technical content is omitted.

Referring to FIG. 1 and FIG. 4 at the same time, a main difference between the manufacturing method of an electronic device 10c of FIG. 4 and the aforementioned manufacturing method of the electronic device 10a is that the second insulating layer IL2 and the first insulating layer IL1 are sequentially bonded to a same surface of the curved substrate SB.

In the embodiment, the step of sequentially bonding the second insulating layer IL2 and the first insulating layer IL1 to the same surface of the curved substrate SB may include the following steps, but the disclosure is not limited thereto.

First, the surface of the second insulating layer IL2 away from the second conductive layer M2 (i.e., the second surface IL2_S2 of the second insulating layer IL2) is bonded to the first surface SB_S1 of the curved substrate SB. Then, the surface of the first insulating layer IL1 away from the first conductive layer M1 (i.e., the second surface IL1_S2 of the first insulating layer IL1) is bonded to the surface of the second insulating layer IL2 close to the second conductive layer M2 (i.e., the first surface IL2_S1 of the second insulating layer IL2).

In some embodiments, the second insulating layer IL2 may be bonded to the first surface SB_S1 of the curved substrate SB through a thermocompression bonding process, but the disclosure is not limited thereto. In other embodiments, an adhesive layer (not shown) may be provided on the first surface SB_S1 of the curved substrate SB first, and then the second insulating layer IL2 may be bonded to the first surface SB_S1 of the curved substrate SB through the adhesive layer.

Figure 5:
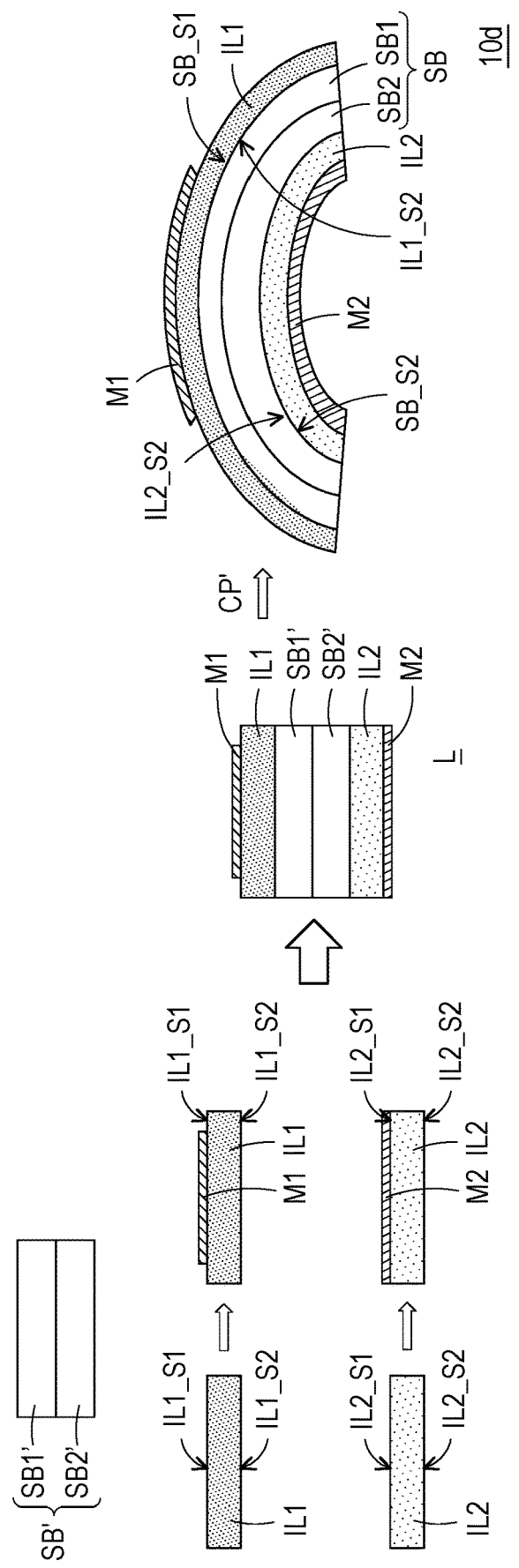
FIG. 5 is a schematic cross-sectional flowchart of a manufacturing method of an electronic device according to a fourth embodiment of the disclosure.

FIG. 5 is a schematic cross-sectional flowchart of a manufacturing method of an electronic device according to a fourth embodiment of the disclosure. It should be noted that the embodiment in FIG. 5 may continue to use the component referential numbers and a part of the content of the embodiment of FIG. 2, where the same or similar referential numbers are used to denote the same or similar components, and the description of the same technical content is omitted.

Referring to FIG. 5, a main difference between the manufacturing method of an electronic device 10d of FIG. 5 and the aforementioned manufacturing method of the electronic device 10a is that after the first insulating layer IL1 and the second insulating layer IL2 are bonded to the un-curved SB' to form a laminated body L, the laminated body L is subjected to a curving process CP' to form the electronic device 10d. In the embodiment, the curving process CP' performed on the laminated body L may be the same as or different from the curving process CP in the above-mentioned embodiment, which is not particularly limited by the disclosure.

Figure 6:
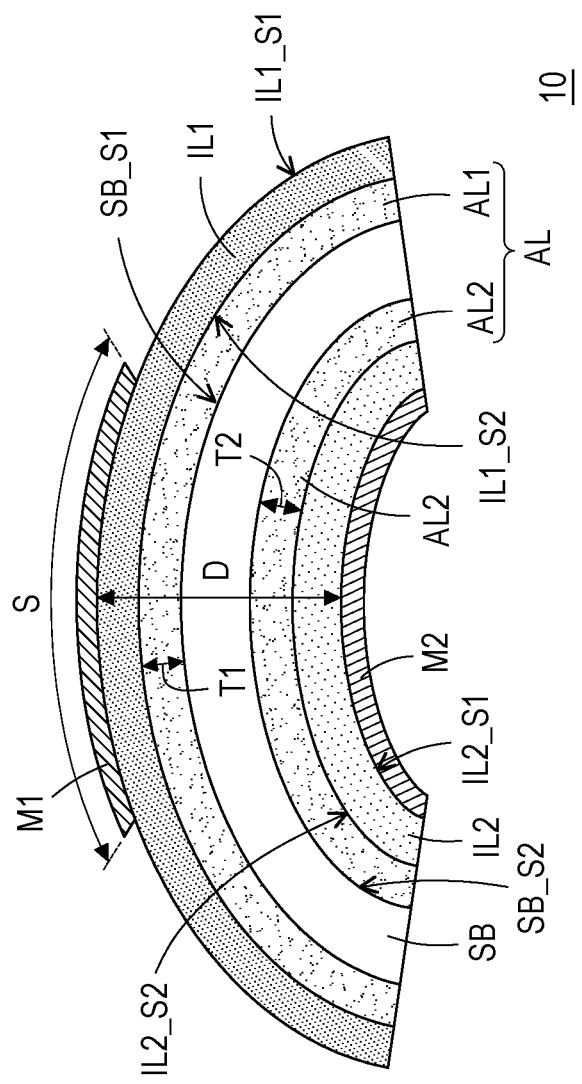
FIG. 6 is a schematic cross-sectional view of an electronic device according to an embodiment of the disclosure.

FIG. 6 is a schematic cross-sectional view of an electronic device 10 according to an embodiment of the disclosure, where the electronic device 10 may be any of the above-mentioned electronic devices 10a, 10b, 10c, or 10d, which is not limited by the disclosure. The configuration of the electronic device 10 of the embodiment will be briefly described below with reference to FIG. 6.

In the embodiment, the electronic device 10 includes a substrate SB, a first conductive layer M1, a first insulating layer IL1, a second conductive layer M2 and a second insulating layer IL2. The substrate SB has, for example, a first surface SB_S1 and a second surface SB_S2 opposite to the first surface SB_S1, where the first surface SB_S1 may be a convex surface, and the second surface SB_S2 may be a concave surface, but the disclosure is not limited thereto. The first conductive layer M1 is, for example, disposed on the first surface SB_S1 of the substrate SB. The first insulating layer IL1 is, for example, disposed between the first conductive layer M1 and the substrate SB. The second conductive layer M2 is, for example, disposed on the second surface SB_S2 of the substrate SB. The second insulating layer IL2 is, for example, disposed between the second conductive layer M2 and the substrate SB.

In the embodiment, the electronic device 10 is an antenna device, which may receive high-frequency signals (such as electromagnetic waves) from the outside or transmit high-frequency signals to the outside. For example, the electronic device 10 may further include a radio frequency circuit (not shown) electrically connected to the second conductive layer M2, where the first conductive layer M1 may be used as a coupling terminal of the electronic device 10, and the second conductive layer M2 may be as an antenna terminal and/or a ground terminal of the electronic device 10. When receiving a high-frequency signal from the outside, the first conductive layer M1 in the electronic device 10 may transmit the high-frequency signal to the second conductive layer M2 in a signal coupling manner, and transmit it to the radio frequency circuit through the second conductive layer M2, and convert the high-frequency signal into a low-frequency signal through the radio frequency circuit. In addition, when a high-frequency signal is to be transmitted to the outside, the radio frequency circuit in the electronic device 10 may convert the generated low-frequency signal into a high-frequency signal and transmit it to the second conductive layer M2, and then the second conductive layer M2 may transmit the high-frequency signal to the first conductive layer M1 in a signal coupling manner, and the first conductive layer M1 transmits the high-frequency signal to the outside.

In the embodiment, the electronic device 10 further includes an adhesive layer AL, where the adhesive layer AL includes a first adhesive layer AL1 and a second adhesive layer AL2. Specifically, the first adhesive layer AL1 is disposed between the first insulating layer IL1 and the substrate SB, and the second adhesive layer AL2 is disposed between the second insulating layer IL2 and the substrate SB, so that the first insulating layer IL1 and the second insulating layer IL1 may be respectively bonded to the substrate SB through the first adhesive layer AL1 and the second adhesive layer AL2. A thickness T1 and a thickness T2 may be obtained, for example, by using a three-dimensional measuring instrument. In some embodiments, the thickness T1 of the first adhesive layer AL1 and the thickness T2 of the second adhesive layer AL2 may be less than a quarter of a wavelength of the signal transmitted between the first conductive layer M1 and the second conductive layer M2.

In some embodiments, a material of the adhesive layer AL may include polyvinyl acetate (PVAc), resorcinol-formaldehyde resin (RF), polyurethane (PU), epoxy resin, ABF carrier, vinyl acetate (VA), chloroprene, cyanoacrylate, anisotropic conductive film, silver paste, gold paste, double-sided copper tape or other suitable materials, which is not limited by the disclosure. In some embodiments, the adhesive layer AL may include a layered adhesive sheet, but the disclosure is not limited thereto. In some other embodiments, the adhesive layer AL may include a sealant (not shown) formed by using a one drop filling (ODF) process, where a space surrounded by the sealant may include a vacuum, an air gap, a liquid material, a solid material or other suitable materials, which is not limited by the disclosure.

In the embodiment, the first conductive layer M1 has an arc length S along a specific direction. The arc length S may be obtained, for example, by using a three-dimensional measuring instrument to measure a distance from one edge of the first conductive layer M1 to its opposite edge. In some embodiments, the arc length S may be between one-half of the wavelength of the signal transmitted between the first conductive layer M1 and the second conductive layer M2 and the wavelength of the signal.

In the embodiment, there is a distance D between the first conductive layer M1 and the second conductive layer M2. The distance D may be obtained, for example, by using a three-dimensional measuring instrument to measure a distance from a bottom surface of the first conductive layer M1 (i.e., the surface bonded to the first insulating layer IL1) to a top surface of the second conductive layer M2 (i.e., the surface bonded to the second insulating layer IL2). In some embodiments, the distance D may be between a quarter of the wavelength of the signal transmitted between the first conductive layer M1 and the second conductive layer M2 and the wavelength of the signal.

In summary, in the electronic device provided by some embodiments of the disclosure, by first curving the substrate before forming the conductive layers (including the first conductive layer and the second conductive layer) on the substrate, it reduces the possibility of peeling and/or offset between the conductive layers and the substrate and/or other insulating layers. In addition, in the electronic devices provided by some embodiments of the disclosure, by respectively forming the first conductive layer and the second conductive layer on different insulating layers, the possibility of damage to the first conductive layer and the second conductive layer due to other processes performed during the manufacturing process of the electronic device may be reduced, so as to improve the yield of the electronic device provided by some embodiments of the present disclosure.

It will be apparent to those skilled in the art that various modifications and variations can be made to the disclosed embodiments without departing from the scope or spirit of the disclosure. In view of the foregoing, it is intended that the disclosure covers modifications and variations provided they fall within the scope of the following claims and their equivalents.

What is claimed is:

1. A manufacturing method of an electronic device, comprising: forming a curved substrate; forming a first conductive layer on a first insulating layer; forming a second conductive layer on a second insulating layer; and bonding the first insulating layer and the second insulating layer to the curved substrate, wherein bonding the first insulating layer and the second insulating layer to the curved substrate comprises: bonding a surface of the first insulating layer away from the first conductive layer to a first surface of the curved substrate; and bonding a surface of the second insulating layer away from the second conductive layer to a second surface of the curved substrate, wherein the first surface and the second surface are opposite to each other.

2. The manufacturing method of the electronic device as recited in claim 1, wherein bonding the first insulating layer and the second insulating layer to the curved substrate comprises:
   bonding a surface of the first insulating layer away from the first conductive layer to a first surface of the curved substrate; and
   bonding a surface of the second insulating layer away from the second conductive layer to a surface of the first insulating layer close to the first conductive layer, wherein the first surface is a convex surface.

3. The manufacturing method of the electronic device as recited in claim 1, wherein the first conductive layer comprises a multilayer structure.

4. The manufacturing method of the electronic device as recited in claim 1, wherein the first insulating layer and the second insulating layer are bonded to the curved substrate through a thermocompression bonding process.

5. The manufacturing method of the electronic device as recited in claim 1, wherein an adhesive layer is disposed on the curved substrate, and the first insulating layer and the second insulating layer are bonded to the curved substrate through the adhesive layer.

6. The manufacturing method of the electronic device as recited in claim 1, wherein forming the curved substrate comprises:
   providing a substrate; and
   performing a curving process to the substrate.

7. The manufacturing method of the electronic device as recited in claim 6, wherein the substrate comprises a multilayer structure.

8. The manufacturing method of the electronic device as recited in claim 1, wherein the first conductive layer has an arc length along a specific direction, the arc length is between one-half of a wavelength of a signal transmitted between the first conductive layer and the second conductive layer and the wavelength of the signal.

9. The manufacturing method of the electronic device as recited in claim 1, wherein a distance between the first conductive layer and the second conductive layer is between a quarter of a wavelength of a signal transmitted between the first conductive layer and the second conductive layer and the wavelength of the signal.

10. The manufacturing method of the electronic device as recited in claim 1, wherein a material of the first insulating layer and a material of the second insulating layer comprise low temperature co-fired ceramic (LTCC), glass fiber (GF), plastic, resin, non-woven material, ceramics, liquid crystal polymer (LCP), cyclo olefin polymer (COP), polyethylene naphthalate (PEN), or a combination thereof.

11. An electronic device, comprising:
a substrate, having a first surface and a second surface opposite to the first surface, wherein the first surface is a convex surface and the second surface is a concave surface;
a first conductive layer, disposed on the first surface of the substrate;
a first insulating layer, disposed between the first conductive layer and the substrate;
a second conductive layer, disposed on the second surface of the substrate; and
a second insulating layer, disposed between the second conductive layer and the substrate,
wherein an adhesive layer is disposed between the first insulating layer and the substrate and/or between the second insulating layer and the substrate,
wherein the first conductive layer has an arc length along a specific direction, the arc length is between one-half of a wavelength of a signal transmitted between the first conductive layer and the second conductive layer and the wavelength of the signal,
wherein a distance between the first conductive layer and the second conductive layer is between a quarter of a wavelength of a signal transmitted between the first conductive layer and the second conductive layer and the wavelength of the signal.

12. The electronic device as recited in claim 11, wherein the adhesive layer comprises a first adhesive layer and a second adhesive layer, the first adhesive layer is disposed between the first insulating layer and the substrate, and the second adhesive layer is disposed between the second insulating layer and the substrate.

13. The electronic device as recited in claim 12, wherein a thickness of the first adhesive layer and a thickness of the second adhesive layer are less than a quarter of the wavelength of the signal transmitted between the first conductive layer and the second conductive layer.

14. The electronic device as recited in claim 11, wherein a material of the adhesive layer comprises polyvinyl acetate (PVAc), resorcinol-formaldehyde resin (RF), polyurethane (PU), epoxy resin, ABF carrier, vinyl acetate (VA), chloroprene, cyanoacrylate, or a combination thereof.

15. The electronic device as recited in claim 11, wherein a material of the first insulating layer comprises low temperature co-fired ceramic (LTCC), glass fiber (GF), plastic, resin, non-woven material, ceramics, liquid crystal polymer (LCP), cyclo olefin polymer (COP), polyethylene naphthalate (PEN), or a combination thereof.

16. The electronic device as recited in claim 11, wherein a material of the first insulating layer comprises polyimide (PI), silicon nitride, silicon oxide, ajinomoto buildup film (ABF) carrier or a combination thereof.

17. The electronic device as recited in claim 11, wherein a material of the second insulating layer comprises low temperature co-fired ceramic (LTCC), glass fiber (GF), plastic, resin, non-woven material, ceramics, liquid crystal polymer (LCP), cyclo olefin polymer (COP), polyethylene naphthalate (PEN), or a combination thereof.

18. The electronic device as recited in claim 11, wherein a material of the second insulating layer comprises polyimide (PI), silicon nitride, silicon oxide, ajinomoto buildup film (ABF) carrier or a combination thereof.

19. The electronic device as recited in claim 11, wherein the electronic device is an antenna device, the first conductive layer serves as a coupling terminal of the electronic device, and the second conductive layer serves as an antenna terminal and/or a ground terminal of the electronic device.

* * * * *